(12) United States Patent
Hsu et al.

(10) Patent No.: US 8,098,792 B2
(45) Date of Patent: Jan. 17, 2012

(54) SHIFT REGISTER CIRCUIT

(75) Inventors: Kuo-Hua Hsu, Hsin-Chu (TW);
Chun-Hsin Liu, Hsin-Chu (TW);
Yung-Chih Chen, Hsin-Chu (TW);
Chih-Ying Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/790,854

(22) Filed: May 31, 2010

(65) Prior Publication Data

US 2011/0158377 A1 Jun. 30, 2011

(30) Foreign Application Priority Data

Dec. 30, 2009 (TW) ................................ 98145953 A

(51) Int. Cl.
*G11C 19/00* (2006.01)
(52) U.S. Cl. ................. 377/64; 377/68; 377/78; 377/79
(58) Field of Classification Search .................. None
See application file for complete search history.

(56) References Cited

U.S. PATENT DOCUMENTS

| | | | |
|---|---|---|---|
| 6,426,743 B1 | 7/2002 | Yeo | |
| 7,310,402 B2 | 12/2007 | Wei | |
| 7,342,568 B2 * | 3/2008 | Wei et al. | 345/100 |
| 7,688,934 B2 * | 3/2010 | Tsai et al. | 377/64 |
| 2004/0046729 A1 | 3/2004 | Moon | |
| 2004/0165692 A1 | 8/2004 | Moon | |
| 2007/0237285 A1 * | 10/2007 | Chien et al. | 377/64 |
| 2009/0041177 A1 * | 2/2009 | Chien et al. | 377/64 |
| 2010/0260312 A1 * | 10/2010 | Tsai et al. | 377/79 |
| 2011/0007863 A1 * | 1/2011 | Tsai et al. | 377/79 |
| 2011/0044423 A1 * | 2/2011 | Lin et al. | 377/64 |

* cited by examiner

*Primary Examiner* — Tuan T Lam

(74) *Attorney, Agent, or Firm* — Winston Hsu; Scott Margo

(57) ABSTRACT

A shift register circuit with waveform-shaping function includes plural shift register stages. Each shift register stage includes a first input unit, a pull-up unit, a pull-down circuit, a second input unit, a control unit and a waveform-shaping unit. The first input unit is utilized for outputting a first driving control voltage in response to a first gate signal. The pull-up unit pulls up a second gate signal in response to the first driving control voltage. The pull-down circuit is employed to pull down the first driving control voltage and the second gate signal. The second input unit is utilized for outputting a second driving control voltage in response to the first gate signal. The control unit provides a control signal in response to the second driving control voltage and an auxiliary signal. The waveform-shaping unit performs a waveform-shaping operation on the second gate signal in response to the control signal.

22 Claims, 7 Drawing Sheets

SHIFT REGISTER CIRCUIT

BACKGROUND OF THE INVENTION

1. Field of the Invention

The present invention relates to a shift register circuit, and more particularly, to a shift register circuit with waveform shaping function.

2. Description of the Prior Art

Along with the advantages of thin appearance, low power consumption, and low radiation, liquid crystal displays (LCDs) have been widely applied in various electronic products for panel displaying. The operation of a liquid crystal display is featured by varying voltage drops between opposite sides of a liquid crystal layer for twisting the angles of the liquid crystal molecules in the liquid crystal layer so that the transmittance of the liquid crystal layer can be controlled for illustrating images with the aid of light source provided by a backlight module. In general, the liquid crystal display comprises plural pixel units, a source driver, and a shift register circuit. The source driver is utilized for providing plural data signals to be written into the pixel units. The shift register circuit comprises a plurality of shift register stages which are employed to generate plural gate signals for controlling the operations of writing the data signals into the pixel units. That is, the shift register circuit is a crucial device for providing a control of writing the data signals into the pixel units.

FIG. 1 is a schematic diagram showing a prior-art shift register circuit. As shown in FIG. 1, the shift register circuit 100 comprises a plurality of shift register stages and, for ease of explanation, illustrates an (N−1)th shift register stage 111, an Nth shift register stage 112 and an (N+1)th shift register stage 113. Each shift register stage is employed to generate one corresponding gate signal furnished to one corresponding gate line based on a first clock CK1 and a second clock CK2 having a phase opposite to the first clock CK1. For instance, the (N−1)th shift register stage 111 is employed to generate a gate signal SGn−1 furnished to a gate line GLn−1, the Nth shift register stage 112 is employed to generate a gate signal SGn furnished to a gate line GLn, and the (N+1)th shift register stage 113 is employed to generate a gate signal SGn+1 furnished to a gate line GLn+1. The Nth shift register stage 112 comprises a pull-up unit 120, an input unit 130, an energy-store unit 125, a discharging unit 140, a pull-down unit 150 and a control unit 160. The pull-up unit 120 pulls up the gate signal SGn in response to a driving control voltage VQn. The discharging unit 140 and the pull-down unit 150 are employed to pull down the driving control voltage VQn and the gate signal SGn respectively in response to a pull-down control signal generated by the control unit 160.

In the operation of the shift register circuit 100, the shift register stages provide the gate signals having periodical pulses to the pixel units for writing the data signals to become plural pixel voltages. However, each pulse of the gate signals is analogous to an ideal square waveform, and the falling edge of each pulse may cause an occurrence of pulling down the written pixel voltages due to the coupling effect of the parasitic capacitors corresponding to the pixel units, which phenomenon is referred to as the feed-through effect. The feed-through effect is likely to incur image flicker, and the display quality of liquid crystal displays using the shift register circuit 100 is therefore degraded.

SUMMARY OF THE INVENTION

In accordance with one embodiment of the present invention, a shift register circuit with waveform shaping function is set forth for providing plural gate signals to plural gate lines. The shift register circuit comprises a plurality of shift register stages. And an Nth shift register stage of the shift register stages comprises a first input unit, a pull-up unit, a pull-down circuit, a second input unit, a control unit, a waveform-shaping unit, and a pull-down unit. The first input unit, electrically connected to an (N−1)th shift register stage of the shift register stages for receiving an (N−1)th gate signal of the gate signals, is utilized for outputting a first driving control voltage in response to the (N−1)th gate signal. The pull-up unit, electrically connected to the first input unit and an Nth gate line of the gate lines, is utilized for pulling up an Nth gate signal of the gate signals in response to the first driving control voltage and a system clock. The Nth gate line is employed to deliver the Nth gate signal. The pull-down circuit, electrically connected to the first input unit and the pull-up unit, is employed to pull down the first driving control voltage and the Nth gate signal. The second input unit, electrically connected to the (N−1)th shift register stage for receiving the (N−1)th gate signal, is utilized for outputting a second driving control voltage in response to the (N−1)th gate signal. The control unit, electrically connected to the second input unit, is utilized for generating a control signal in response to the second driving control voltage and an auxiliary signal. The waveform-shaping unit, electrically connected to the control unit and the Nth gate line, is utilized for performing a waveform-shaping operation on the Nth gate signal in response to the control signal. The pull-down unit, electrically connected to an (N+1)th shift register stage of the shift register stages for receiving an (N+1)th gate signal of the gate signals, is utilized for pulling down the second driving control voltage in response to the (N+1)th gate signal.

In accordance with another embodiment of the present invention, a shift register circuit with waveform shaping function is set forth for providing plural gate signals to plural gate lines. The shift register circuit comprises a plurality of shift register stages. And an Nth shift register stage of the shift register stages comprises an input unit, a pull-up unit, a pull-down circuit, a control unit, and a waveform-shaping unit. The input unit, electrically connected to an (N−1)th shift register stage of the shift register stages for receiving an (N−1)th gate signal of the gate signals, is utilized for outputting a driving control voltage in response to the (N−1)th gate signal. The pull-up unit, electrically connected to the input unit and an Nth gate line of the gate lines, is utilized for pulling up an Nth gate signal of the gate signals in response to the driving control voltage and a system clock. The Nth gate line is employed to deliver the Nth gate signal. The pull-down circuit, electrically connected to the input unit and the pull-up unit, is employed to pull down the driving control voltage and the Nth gate signal. The control unit, electrically connected to the input unit, is utilized for generating a control signal in response to the driving control voltage and an auxiliary signal. The waveform-shaping unit, electrically connected to the control unit and the Nth gate line, is utilized for performing a waveform-shaping operation on the Nth gate signal in response to the control signal.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
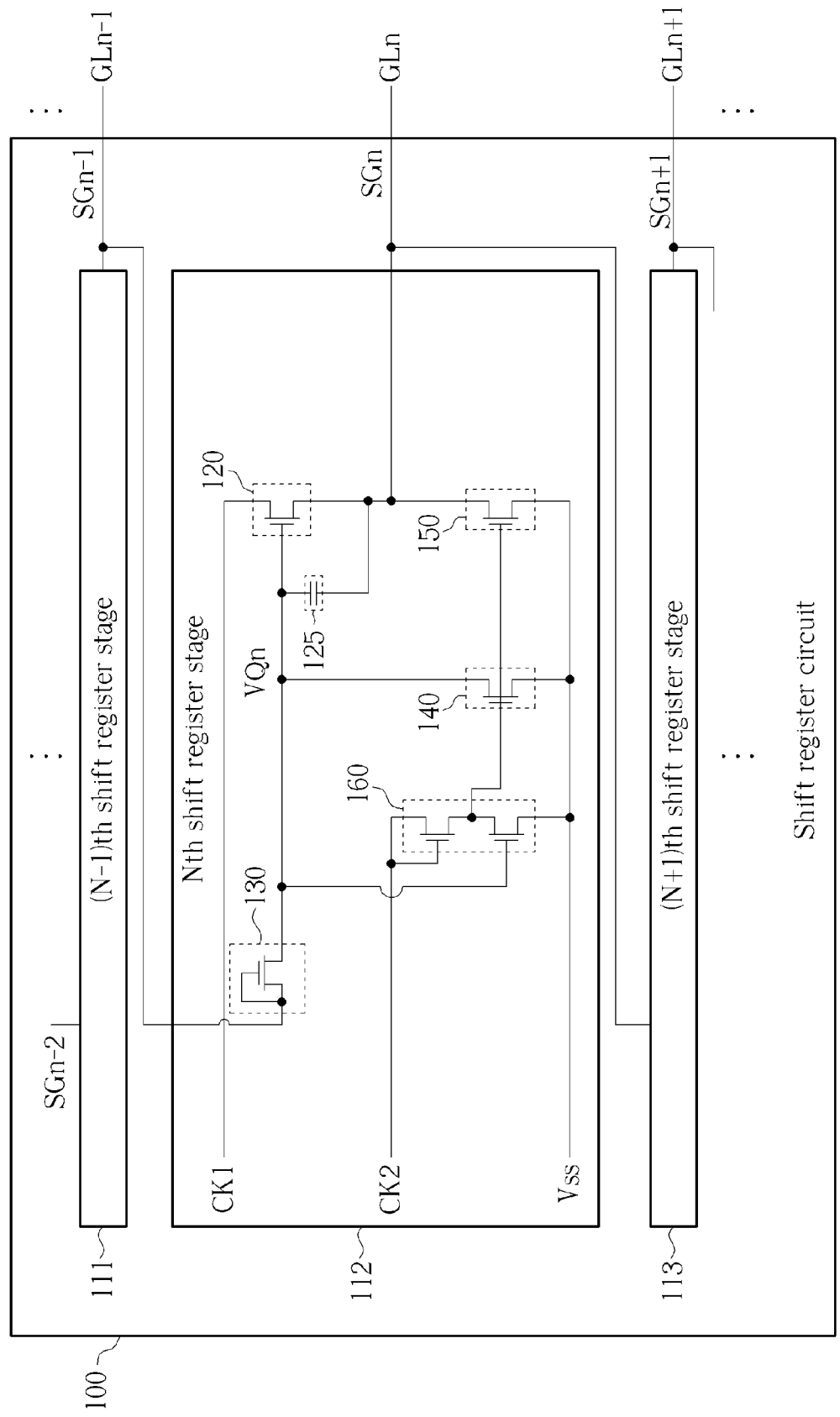
FIG. 1 is a schematic diagram showing a prior-art shift register circuit.
Figure 2:
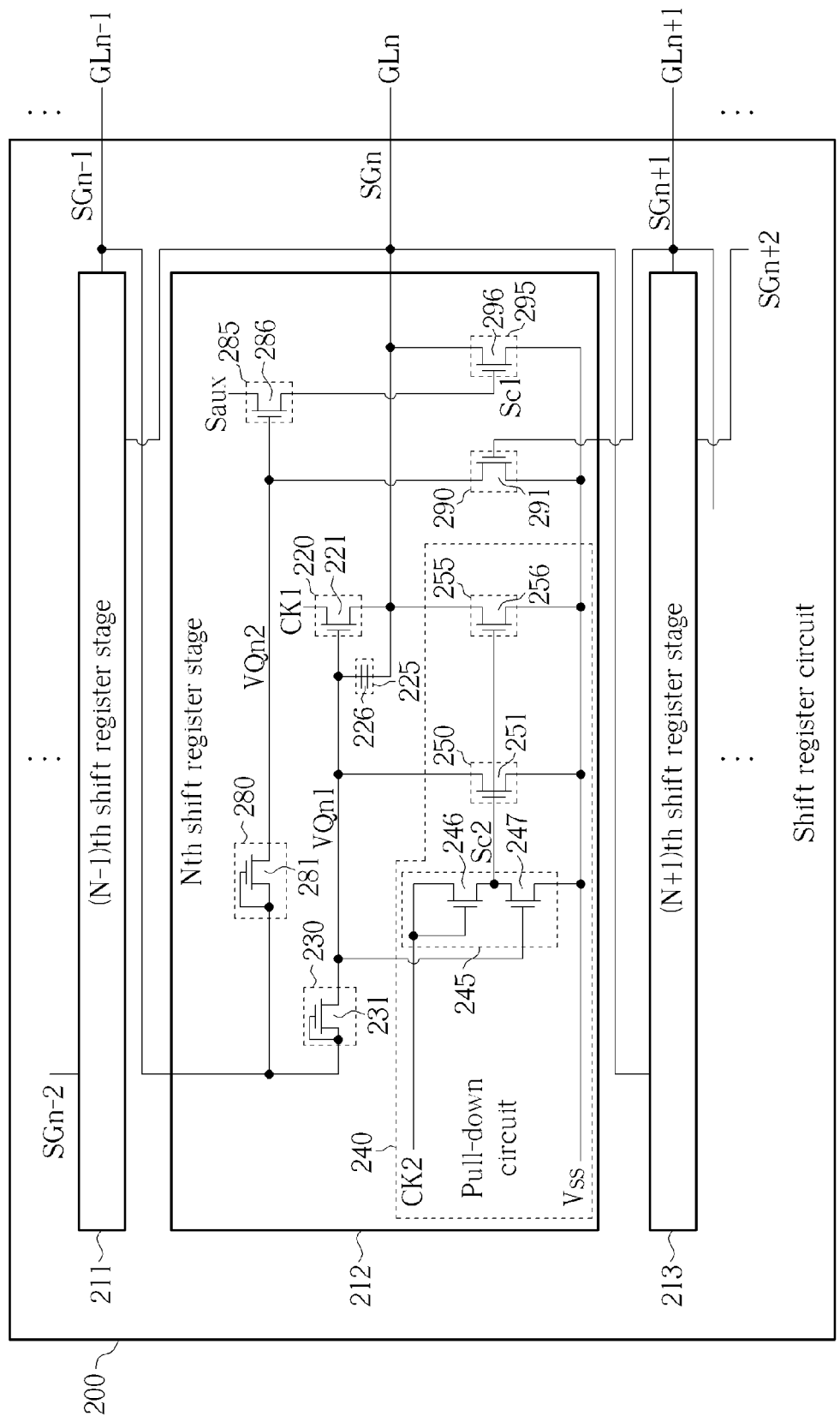
FIG. 2 is a schematic diagram showing a shift register circuit in accordance with a first embodiment of the present invention.

FIG. 2 is a schematic diagram showing a shift register circuit in accordance with a first embodiment of the present invention. As shown in FIG. 2, the shift register circuit 200 comprises a plurality of shift register stages and, for ease of explanation, illustrates an (N−1)th shift register stage 211, an Nth shift register stage 212 and an (N+1)th shift register stage 213. For the sake of brevity, only the internal structure of the Nth shift register stage 212 is exemplified in detail. The other shift register stages are similar to the Nth shift register stage 212 and can be inferred by analogy. In the operation of the shift register circuit 200, the (N−1)th shift register stage 211 is employed to generate a gate signal SGn−1 furnished to a gate line GLn−1, the Nth shift register stage 212 is employed to generate a gate signal SGn furnished to a gate line GLn, and the (N+1)th shift register stage 213 is employed to generate a gate signal SGn+1 furnished to a gate line GLn+1.

The Nth shift register stage 212 comprises a pull-up unit 220, a first input unit 230, an energy-store unit 225, a pull-down circuit 240, a second input unit 280, a first control unit 285, a first pull-down unit 290 and a waveform-shaping unit 295. The first input unit 230, electrically connected to the (N−1)th shift register stage 211, is utilized for outputting a first driving control voltage VQn1 in response to the gate signal SGn−1. That is, the gate signal SGn−1 also functions as a start pulse signal for enabling the Nth shift register stage 212. The energy-store unit 225, electrically connected to the first input unit 230 and the pull-up unit 220, functions to store the first driving control voltage VQn1. The pull-up unit 220, electrically connected to the first input unit 230 and the gate line GLn, is put in use for pulling up the gate signal SGn of the gate line GLn in response to the first driving control voltage VQn1 and a first clock CK1. The pull-down circuit 240 comprises a second control unit 245, a second pull-down unit 255 and a third pull-down unit 250. The second control unit 245, electrically connected to the first input unit 230, is utilized for generating a second control signal Sc2 in response to the first driving control voltage VQn1 and a second clock CK2 having a phase opposite to the first clock CK1. The second pull-down unit 255, electrically connected to the second control unit 245 and the gate line GLn, is utilized for pulling down the gate signal SGn in response to the second control signal Sc2. The third pull-down unit 250, electrically connected to the second control unit 245 and the first input unit 230, is utilized for pulling down the first driving control voltage VQn1 in response to the second control signal Sc2.

The second input unit 280, electrically connected to the (N−1)th shift register stage 211, is utilized for outputting a second driving control voltage VQn2 in response to the gate signal SGn−1. The first control unit 285, electrically connected to the second input unit 280, is utilized for generating a first control signal Sc1 in response to the second driving control voltage VQn2 and an auxiliary signal Saux. The first pull-down unit 290, electrically connected to the (N+1)th shift register stage 213 and the second input unit 280, is utilized for pulling down the second driving control voltage VQn2 in response to the gate signal SGn+1. The waveform-shaping unit 295, electrically connected to the first control unit 285 and the gate line GLn, is utilized for performing a waveform-shaping operation on the gate signal SGn in response to the first control signal Sc1.

In the embodiment shown in FIG. 2, the pull-up unit 220 comprises a first transistor 221, the first input unit 230 comprises a second transistor 231, the energy-store unit 225 comprises a capacitor 226, the second input unit 280 comprises a third transistor 281, the first control unit 285 comprises a fourth transistor 286, the first pull-down unit 290 comprises a fifth transistor 291, the waveform-shaping unit 295 comprises a sixth transistor 296, the second pull-down unit 255 comprises a seventh transistor 256, the third pull-down unit 250 comprises an eighth transistor 251, and the second control unit 245 comprises a ninth transistor 246 and a tenth transistor 247. The first transistor 221 through the tenth transistor 247 are thin film transistors or field effect transistors.

The first transistor 221 comprises a first end for receiving the first clock CK1, a second end electrically connected to the gate line GLn, and a gate end electrically connected to the first input unit 230. The capacitor 226 is electrically connected between the gate and second ends of the first transistor 221. The second transistor 231 comprises a first end electrically connected to the (N−1)th shift register stage 211 for receiving the gate signal SGn−1, a gate end electrically connected to the first end, and a second end electrically connected to the gate end of the first transistor 221. The third transistor 281 comprises a first end electrically connected to the (N−1)th shift register stage 211 for receiving the gate signal SGn−1, a gate end electrically connected to the first end, and a second end electrically connected to the first control unit 285. The fourth transistor 286 comprises a first end for receiving the auxiliary signal Saux, a second end electrically connected to the waveform-shaping unit 295, and a gate end electrically connected to the second end of the third transistor 281. The fifth transistor 291 comprises a first end electrically connected to the second end of the third transistor 281, a second end for receiving a low power voltage Vss, and a gate end electrically connected to the (N+1)th shift register stage 213 for receiving the gate signal SGn+1. The sixth transistor 296 comprises a first end electrically connected to the gate line GLn, a second end for receiving the low power voltage Vss, and a gate end electrically connected to the second end of the fourth transistor 286.

The seventh transistor 256 comprises a first end electrically connected to the gate line GLn, a gate end electrically connected to the second control unit 245 for receiving the second control signal Sc2, and a second end for receiving the low power voltage Vss. The eighth transistor 251 comprises a first end electrically connected to the second end of the second transistor 231, a gate end electrically connected to the second control unit 245 for receiving the second control signal Sc2, and a second end for receiving the low power voltage Vss. The ninth transistor 246 comprises a first end for receiving the second clock CK2, a gate end electrically connected to the first end, and a second end electrically connected to both the gate ends of the seventh transistor 256 and the eighth transistor 251. The tenth transistor 247 comprises a first end electrically connected to the second end of the ninth transistor 246, a gate end electrically connected to the second end of the second transistor 231, and a second end for receiving the low power voltage Vss.

Figure 3:
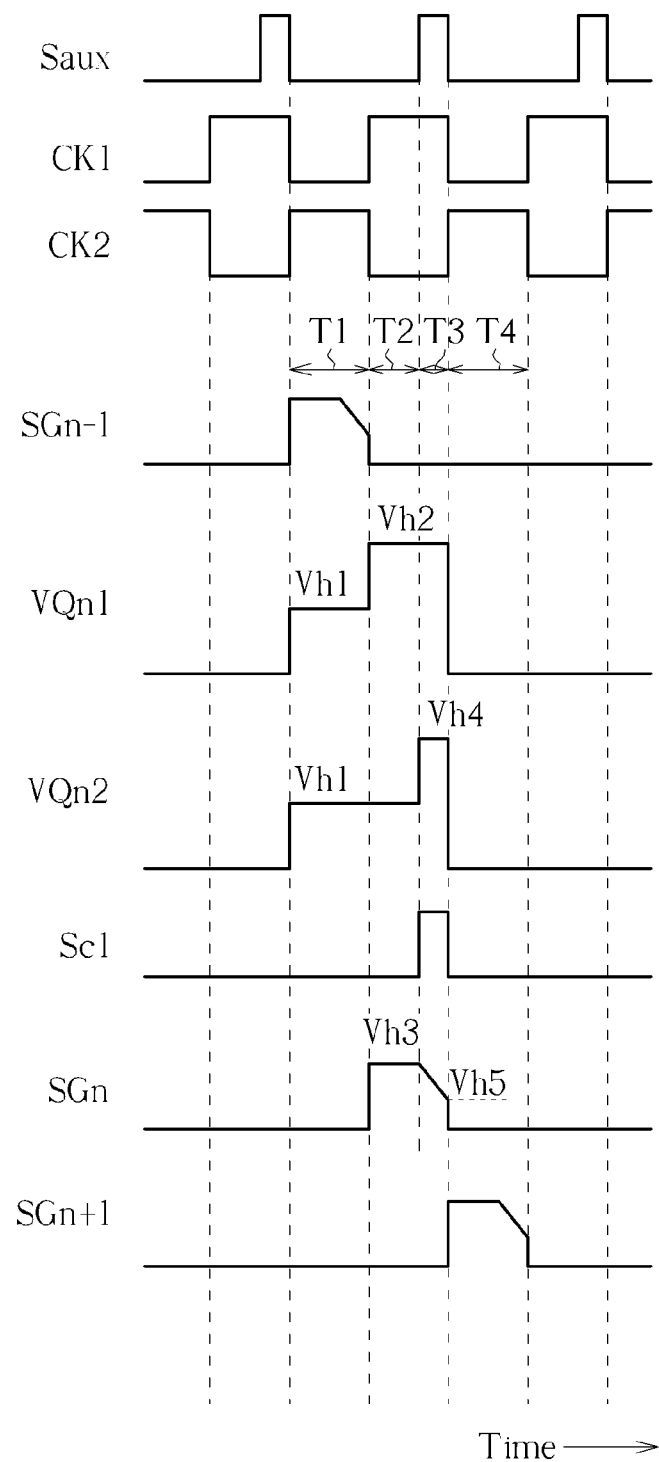
FIG. 3 is a schematic diagram showing related signal waveforms regarding the operation of the shift register circuit in FIG. 2, having time along the abscissa.

FIG. 3 is a schematic diagram showing related signal waveforms regarding the operation of the shift register circuit 200 in FIG. 2, having time along the abscissa. The signal waveforms in FIG. 3, from top to bottom, are the auxiliary signal Saux, the first clock CK1, the second clock CK2, the gate signal SGn−1, the first driving control voltage VQn1, the second driving control voltage VQn2, the first control signal Sc1, the gate signal SGn and the gate signal SGn+1. As shown in FIG. 3, during an interval T1, the gate signal SGn−1 is switching from low-level voltage to high-level voltage, and the second transistor 231 and the third transistor 281 are then turned on. Accordingly, both the first driving control voltage VQn1 and the second driving control voltage VQn2 are shifting up to a first high voltage Vh1 for turning on the first transistor 221 and the fourth transistor 286 respectively. Meanwhile, the capacitor 226 is utilized for storing the first driving control voltage VQn1, and the first driving control voltage VQn1 is further employed to turn on the tenth transistor 247 for pulling down the second control signal Sc2 to the low power voltage Vss so as to turn off both the seventh transistor 256 and the eighth transistor 251.

During an interval T2, the gate signal SGn−1 is switching from high-level voltage to low-level voltage, and the second transistor 231 and the third transistor 281 are then turned off. Accordingly, both the first driving control voltage VQn1 and the second driving control voltage VQn2 become floating voltages. Concurrently, along with the switching of the first clock CK1 from low-level voltage to high-level voltage, the first driving control voltage VQn1 is further boosted from the first high voltage Vh1 to a second high voltage Vh2 due to a capacitive coupling effect caused by the device capacitor of the first transistor 221. Accordingly, the first transistor 221 is continuously turned on and the gate signal SGn is then pulled up from low-level voltage to a third high voltage Vh3.

During an interval T3, the auxiliary signal Saux is switching from low-level voltage to high-level voltage, and therefore the second driving control voltage VQn2 is further boosted from the first high voltage Vh1 to a fourth high voltage Vh4 due to a capacitive coupling effect caused by the device capacitor of the fourth transistor 286. Accordingly, the fourth transistor 286 is continuously turned on and the first control signal Sc1 is then pulled up from low-level voltage to high-level voltage. Meanwhile, the first control signal Sc1 with high-level voltage turns on the sixth transistor 296 and, in turn, the gate signal SGn is decreasing from the third high voltage Vh3 to a fifth high voltage Vh5 during the interval T3.

During an interval T4, the first clock CK1 is switching from high-level voltage to low-level voltage, and therefore the gate signal SGn is shifting from the fifth high voltage Vh5 to low-level voltage. Also, the first driving control voltage VQn1 is pulled down to low-level voltage due to a coupling effect of the capacitor 226. And the tenth transistor 247 is therefore turned off. In the meantime, since the second control signal Sc2 is shifting up to high-level voltage following a change of the second clock CK2 from low-level voltage to high-level voltage, the seventh transistor 256 and the eighth transistor 251 are then turned on for pulling down the gate signal SGn and the first driving control voltage VQn1 to low-level voltage. Besides, by making use of the gate signal SGn as a start pulse signal, the (N+1)th shift register stage 213 is enabled to generate the gate signal SGn+1 having high-level voltage during the interval T4, and therefore the fifth transistor 291 is turned on for pulling down the second driving control voltage VQn2 from the fourth high voltage Vh4 to the low power voltage Vss during the interval T4. It is noted that the falling edge of the gate signal SGn is shifting from the fifth high voltage Vh5 down to low-level voltage, instead of shifting from the third high voltage Vh3 down to low-level voltage, and therefore the voltage difference of the falling edge can be significantly reduced for mitigating the feed-through effect. For that reason, the display quality of liquid crystal displays using the shift register circuit 200 can be enhanced following a reduction of image flicker.

Figure 4:
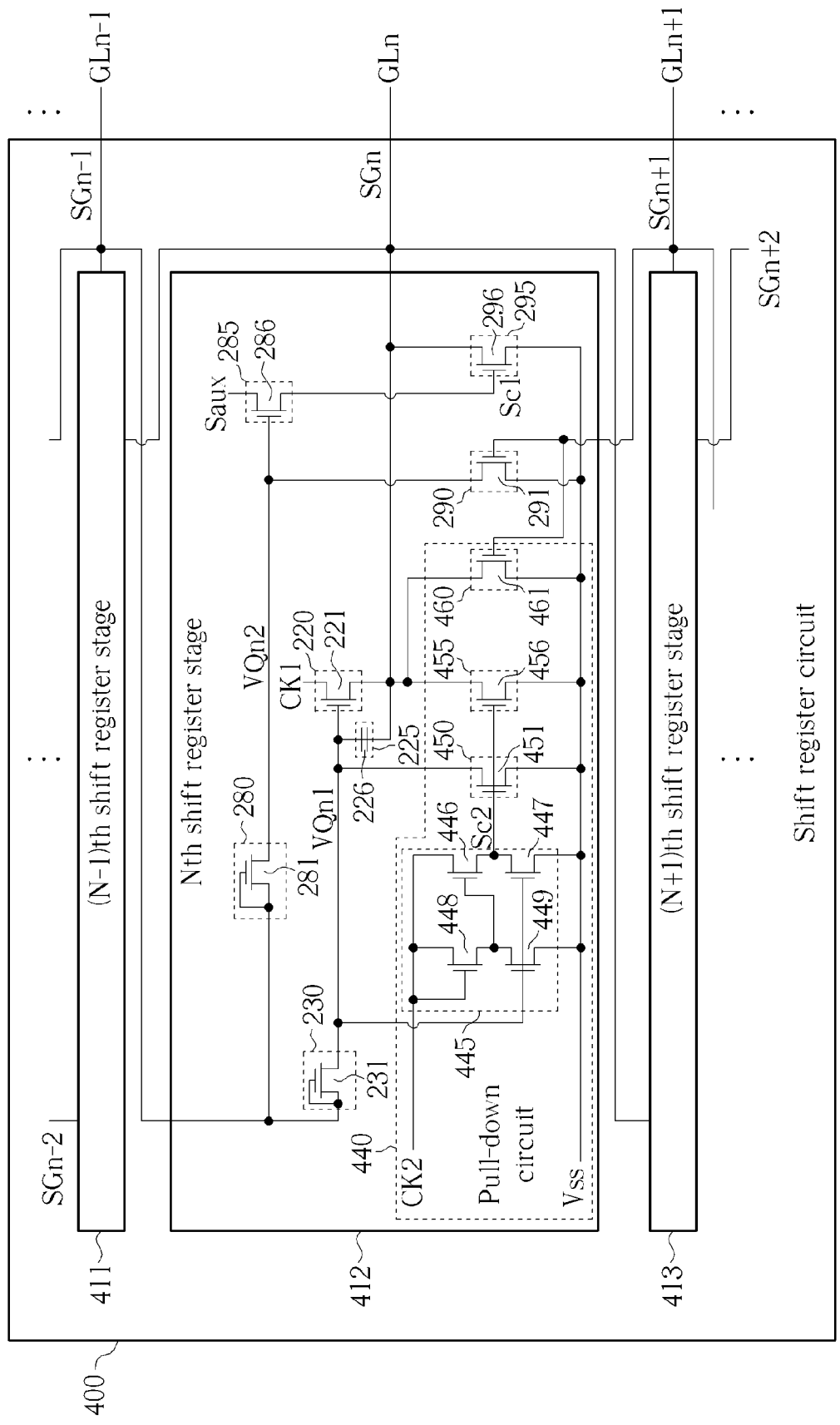
FIG. 4 is a schematic diagram showing a shift register circuit in accordance with a second embodiment of the present invention.

FIG. 4 is a schematic diagram showing a shift register circuit in accordance with a second embodiment of the present invention. As shown in FIG. 4, the shift register circuit 400 comprises a plurality of shift register stages and, for ease of explanation, illustrates an (N−1)th shift register stage 411, an Nth shift register stage 412 and an (N+1)th shift register stage 413. For the sake of brevity, only the internal structure of the Nth shift register stage 412 is exemplified in detail. The other shift register stages are similar to the Nth shift register stage 412 and can be inferred by analogy. The circuit structure of the Nth shift register stage 412 is similar to that of the Nth shift register stage 212 shown in FIG. 2, differing in that the pull-down circuit 240 is replaced with the pull-down circuit 440. The pull-down circuit 440 comprises a second control unit 445, a second pull-down unit 455, a third pull-down unit 450 and a fourth pull-down unit 460. The second control unit 445, electrically connected to the first input unit 230, is utilized for generating a second control signal Sc2 in response to the first driving control voltage VQn1 and the second clock CK2. The second pull-down unit 455, electrically connected to the second control unit 445 and the gate line GLn, is utilized for pulling down the gate signal SGn in response to the second control signal Sc2. The third pull-down unit 450, electrically connected to the second control unit 445 and the first input unit 230, is utilized for pulling down the first driving control voltage VQn1 in response to the second control signal Sc2. The fourth pull-down unit 460, electrically connected to the (N+1)th shift register stage 413 and the gate line GLn, is utilized for pulling down the gate signal SGn in response to the gate signal SGn+1.

In the embodiment shown in FIG. 4, the second pull-down unit 455 comprises a seventh transistor 456, the third pull-down unit 450 comprises an eighth transistor 451, the second control unit 445 comprises a ninth transistor 446, a tenth transistor 447, an eleventh transistor 448 and a twelfth transistor 449, and the fourth pull-down unit 460 comprises a thirteenth transistor 461. The seventh transistor 456 through the thirteenth transistor 461 are thin film transistors or field effect transistors. The seventh transistor 456 comprises a first end electrically connected to the gate line GLn, a gate end electrically connected to the second control unit 445 for receiving the second control signal Sc2, and a second end for receiving the low power voltage Vss. The eighth transistor 451 comprises a first end electrically connected to the second end of the second transistor 231, a gate end electrically connected to the second control unit 445 for receiving the second control signal Sc2, and a second end for receiving the low power voltage Vss.

The ninth transistor 446 comprises a first end for receiving the second clock CK2, a second end electrically connected to both the gate ends of the seventh transistor 456 and the eighth transistor 451, and a gate end electrically connected to the eleventh transistor 448. The tenth transistor 447 comprises a first end electrically connected to the second end of the ninth transistor 446, a gate end electrically connected to the second end of the second transistor 231, and a second end for receiving the low power voltage Vss. The eleventh transistor 448 comprises a first end for receiving the second clock CK2, a gate end electrically connected to the first end, and a second end electrically connected to the gate end of the ninth transistor 446. The twelfth transistor 449 comprises a first end electrically connected to the second end of the eleventh transistor 448, a gate end electrically connected to the second end of the second transistor 231, and a second end for receiving the low power voltage Vss. The thirteenth transistor 461 comprises a first end electrically connected to the gate line GLn, a gate end electrically connected to the (N+1)th shift register stage 413 for receiving the gate signal SGn+1, and a second end for receiving the low power voltage Vss.

The signal waveforms regarding the operation of the shift register circuit 400 are substantially identical to the signal waveforms shown in FIG. 3. In the operation of the shift register circuit 400, during the interval T4, the thirteenth transistor 461 is capable of pulling down the gate signal SGn in response to the gate signal SGn+1. That is, both the seventh transistor 456 and the thirteenth transistor 461 are employed to pull down the gate signal SGn. The internal structure of the second control unit 445 is well known to those skilled in the art and, for the sake of brevity, further similar discussion thereof is omitted.

Figure 5:
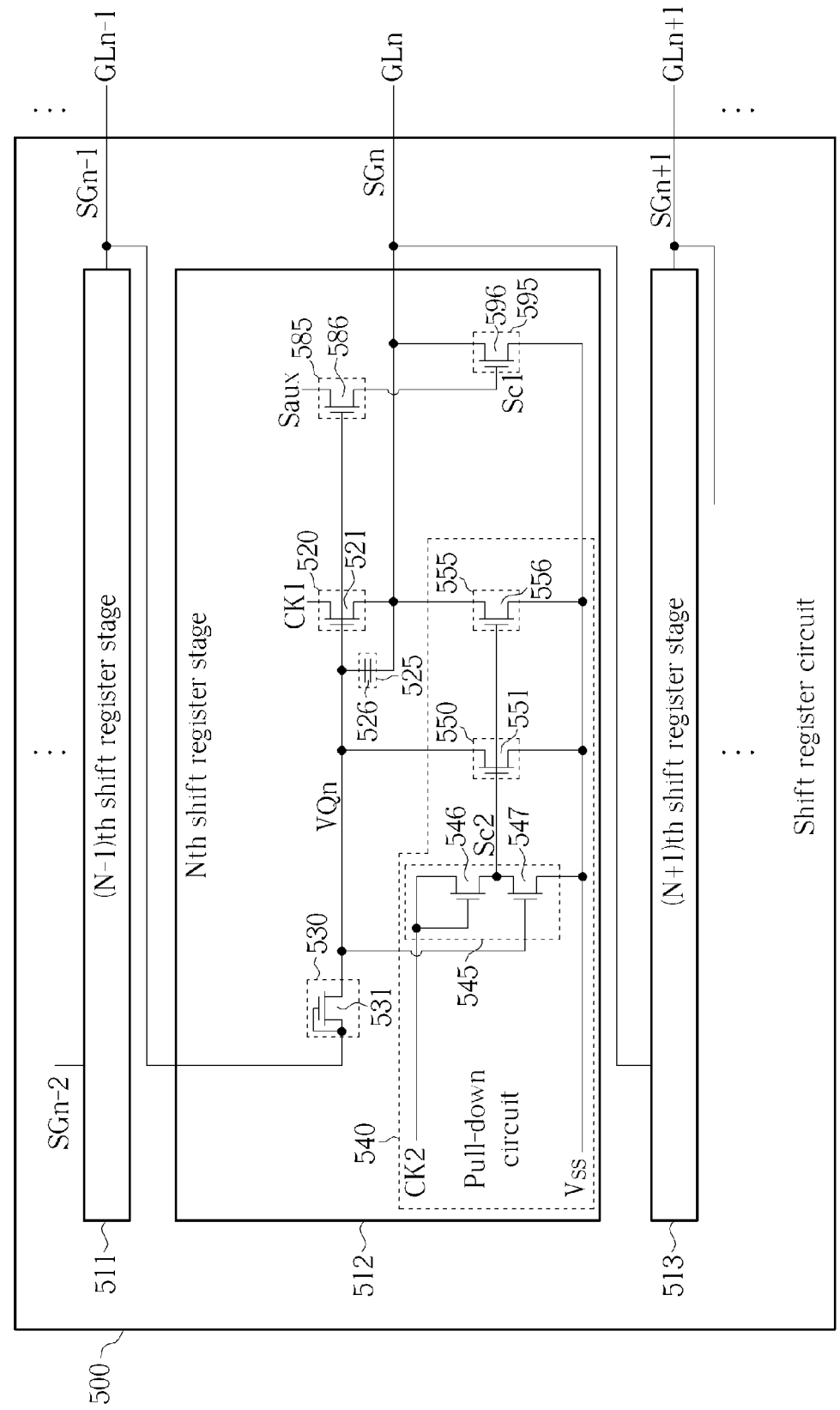
FIG. 5 is a schematic diagram showing a shift register circuit in accordance with a third embodiment of the present invention.

FIG. 5 is a schematic diagram showing a shift register circuit in accordance with a third embodiment of the present invention. As shown in FIG. 5, the shift register circuit 500 comprises a plurality of shift register stages and, for ease of explanation, illustrates an (N−1)th shift register stage 511, an Nth shift register stage 512 and an (N+1)th shift register stage 513. For the sake of brevity, only the internal structure of the Nth shift register stage 512 is exemplified in detail. The other shift register stages are similar to the Nth shift register stage 512 and can be inferred by analogy. In the operation of the shift register circuit 500, the (N−1)th shift register stage 511 is employed to generate a gate signal SGn−1 furnished to a gate line GLn−1, the Nth shift register stage 512 is employed to generate a gate signal SGn furnished to a gate line GLn, and the (N+1)th shift register stage 513 is employed to generate a gate signal SGn+1 furnished to a gate line GLn+1.

The Nth shift register stage 512 comprises a pull-up unit 520, an input unit 530, an energy-store unit 525, a pull-down circuit 540, a first control unit 585 and a waveform-shaping unit 595. The input unit 530, electrically connected to the (N−1)th shift register stage 511, is utilized for outputting a driving control voltage VQn in response to the gate signal SGn−1. That is, the gate signal SGn−1 also functions as a start pulse signal for enabling the Nth shift register stage 512. The energy-store unit 525, electrically connected to the input unit 530 and the pull-up unit 520, functions to store the driving control voltage VQn. The pull-up unit 520, electrically connected to the input unit 530 and the gate line GLn, is put in use for pulling up the gate signal SGn of the gate line GLn in response to the driving control voltage VQn and a first clock CK1.

The pull-down circuit 540 comprises a second control unit 545, a first pull-down unit 555 and a second pull-down unit 550. The second control unit 545, electrically connected to the input unit 530, is utilized for generating a second control signal Sc2 in response to the driving control voltage VQn and a second clock CK2 having a phase opposite to the first clock CK1. The first pull-down unit 555, electrically connected to the second control unit 545 and the gate line GLn, is utilized for pulling down the gate signal SGn in response to the second control signal Sc2. The second pull-down unit 550, electrically connected to the second control unit 545 and the input unit 530, is utilized for pulling down the driving control voltage VQn in response to the second control signal Sc2. The first control unit 585, electrically connected to the input unit 530, is utilized for generating a first control signal Sc1 in response to the driving control voltage VQn and an auxiliary signal Saux. The waveform-shaping unit 595, electrically connected to the first control unit 585 and the gate line GLn, is utilized for performing a waveform-shaping operation on the gate signal SGn in response to the first control signal Sc1.

In the embodiment shown in FIG. 5, the pull-up unit 520 comprises a first transistor 521, the input unit 530 comprises a second transistor 531, the energy-store unit 525 comprises a capacitor 526, the first control unit 585 comprises a third transistor 586, the waveform-shaping unit 595 comprises a fourth transistor 596, the first pull-down unit 555 comprises a fifth transistor 556, the second pull-down unit 550 comprises a sixth transistor 551, and the second control unit 545 comprises a seventh transistor 546 and an eighth transistor 547. The first transistor 521 through the eighth transistor 547 are thin film transistors or field effect transistors.

The first transistor 521 comprises a first end for receiving the first clock CK1, a second end electrically connected to the gate line GLn, and a gate end electrically connected to the input unit 530. The capacitor 526 is electrically connected between the gate and second ends of the first transistor 521. The second transistor 531 comprises a first end electrically connected to the (N−1)th shift register stage 511 for receiving the gate signal SGn−1, a gate end electrically connected to the first end, and a second end electrically connected to the gate end of the first transistor 521. The third transistor 586 comprises a first end for receiving the auxiliary signal Saux, a second end electrically connected to the waveform-shaping unit 595, and a gate end electrically connected to the second end of the second transistor 531. The fourth transistor 596 comprises a first end electrically connected to the gate line GLn, a second end for receiving the low power voltage Vss, and a gate end electrically connected to the second end of the third transistor 586.

The fifth transistor 556 comprises a first end electrically connected to the gate line GLn, a gate end electrically connected to the second control unit 545 for receiving the second control signal Sc2, and a second end for receiving the low power voltage Vss. The sixth transistor 551 comprises a first end electrically connected to the second end of the second transistor 531, a gate end electrically connected to the second control unit 545 for receiving the second control signal Sc2, and a second end for receiving the low power voltage Vss. The seventh transistor 546 comprises a first end for receiving the second clock CK2, a gate end electrically connected to the first end, and a second end electrically connected to both the gate ends of the fifth transistor 556 and the sixth transistor 551. The eighth transistor 547 comprises a first end electrically connected to the second end of the seventh transistor 546, a gate end electrically connected to the second end of the second transistor 531, and a second end for receiving the low power voltage Vss.

Figure 6:
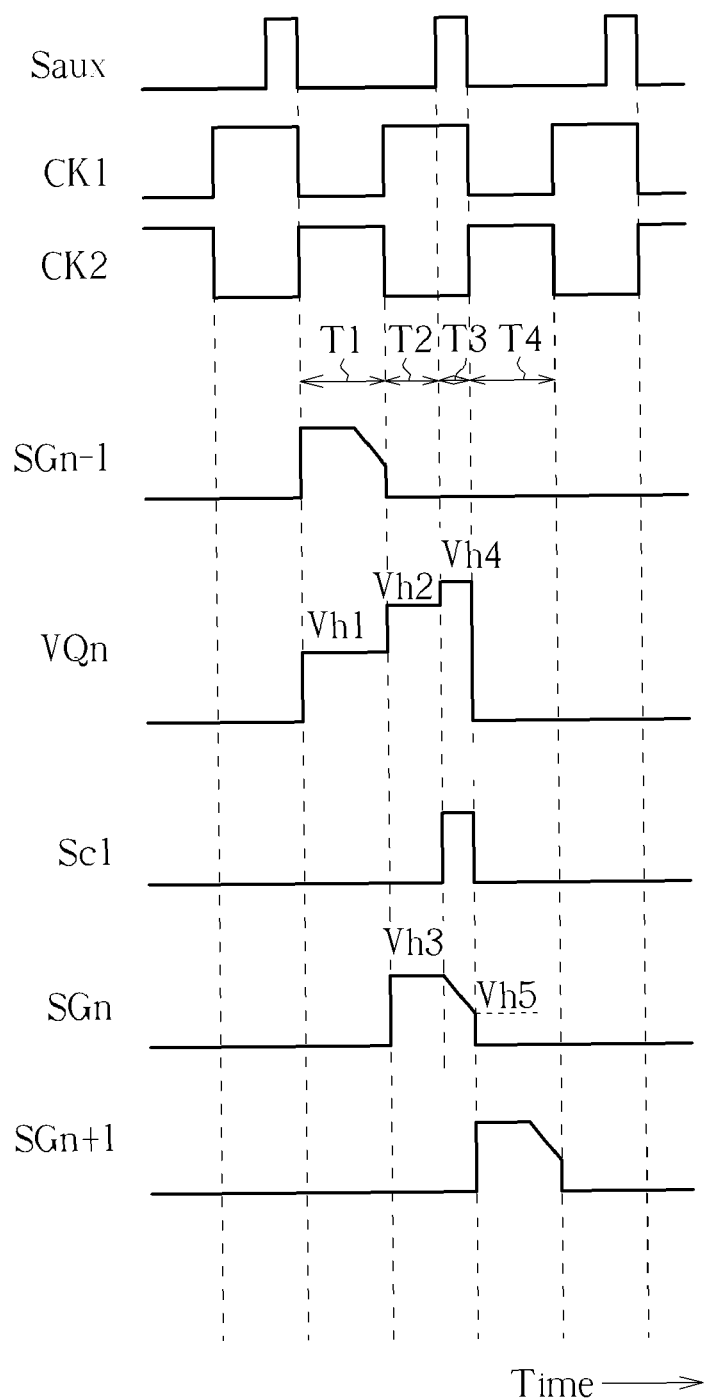
FIG. 6 is a schematic diagram showing related signal waveforms regarding the operation of the shift register circuit in FIG. 5, having time along the abscissa.

FIG. 6 is a schematic diagram showing related signal waveforms regarding the operation of the shift register circuit 500 in FIG. 5, having time along the abscissa. The signal waveforms in FIG. 6, from top to bottom, are the auxiliary signal Saux, the first clock CK1, the second clock CK2, the gate signal SGn−1, the driving control voltage VQn, the first control signal Sc1, the gate signal SGn and the gate signal SGn+1. As shown in FIG. 6, during an interval T1, the gate signal SGn−1 is switching from low-level voltage to high-level voltage, and the second transistor 531 is then turned on. Accordingly, the driving control voltage VQn is shifting up to a first high voltage Vh1 for turning on the first transistor 521 and the third transistor 586. Meanwhile, the capacitor 526 is utilized for storing the driving control voltage VQn, and the driving control voltage VQn is further employed to turn on the eighth transistor 547 for pulling down the second control signal Sc2 to the low power voltage Vss so as to turn off both the fifth transistor 556 and the sixth transistor 551.

During an interval T2, the gate signal SGn−1 is switching from high-level voltage to low-level voltage, and the second transistor 531 is then turned off. Accordingly, the driving control voltage VQn becomes a floating voltage. Concurrently, along with the switching of the first clock CK1 from low-level voltage to high-level voltage, the driving control voltage VQn is further boosted from the first high voltage Vh1 to a second high voltage Vh2 due to a capacitive coupling effect caused by the device capacitor of the first transistor 521. Accordingly, the first transistor 521 and the third transistor 586 are continuously turned on, and the gate signal SGn is then pulled up from low-level voltage to a third high voltage Vh3.

During an interval T3, the auxiliary signal Saux is switching from low-level voltage to high-level voltage, and therefore the driving control voltage VQn is further boosted from the second high voltage Vh2 to a fourth high voltage Vh4 due to a capacitive coupling effect caused by the device capacitor of the third transistor 586. Accordingly, the first transistor 521 and the third transistor 586 are continuously turned on, and the first control signal Sc1 is then pulled up from low-level voltage to high-level voltage. It is noted that the size of the device capacitor of the third transistor 586 has an effect on the voltage difference between the fourth high voltage Vh4 and the second high voltage Vh2. In the meantime, the first control signal Sc1 with high-level voltage turns on the fourth transistor 596 and, in turn, the gate signal SGn is decreasing from the third high voltage Vh3 to a fifth high voltage Vh5 during the interval T3.

During an interval T4, the first clock CK1 is switching from high-level voltage to low-level voltage, and therefore the gate signal SGn is shifting from the fifth high voltage Vh5 to low-level voltage. Also, the driving control voltage VQn is pulled down to low-level voltage due to a coupling effect of the capacitor 526. And the eighth transistor 547 is therefore turned off. In the meantime, since the second control signal Sc2 is shifting up to high-level voltage following a change of the second clock CK2 from low-level voltage to high-level voltage, the fifth transistor 556 and the sixth transistor 551 are then turned on for pulling down the gate signal SGn and the driving control voltage VQn to low-level voltage. Besides, by making use of the gate signal SGn as a start pulse signal, the (N+1)th shift register stage 513 is enabled to generate the gate signal SGn+1 having high-level voltage during the interval T4. Similarly, the falling edge of the gate signal SGn is shifting from the fifth high voltage Vh5 down to low-level voltage, instead of shifting from the third high voltage Vh3 down to low-level voltage, and therefore the voltage difference of the falling edge can be significantly reduced for mitigating the feed-through effect. For that reason, the display quality of liquid crystal displays using the shift register circuit 500 can be enhanced following a reduction of image flicker.

Figure 7:
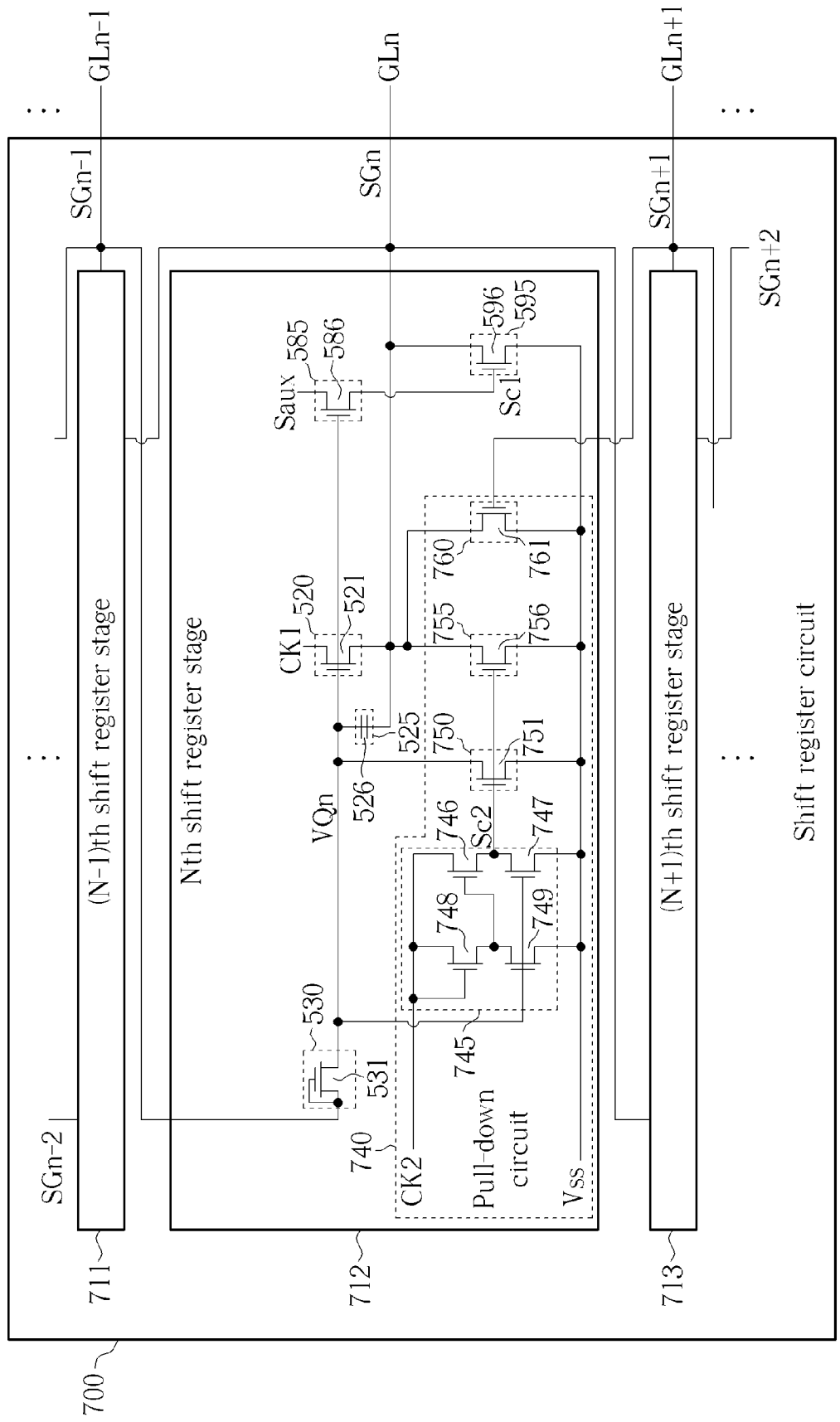
FIG. 7 is a schematic diagram showing a shift register circuit in accordance with a fourth embodiment of the present invention.

FIG. 7 is a schematic diagram showing a shift register circuit in accordance with a fourth embodiment of the present invention. As shown in FIG. 7, the shift register circuit 700 comprises a plurality of shift register stages and, for ease of explanation, illustrates an (N−1)th shift register stage 711, an Nth shift register stage 712 and an (N+1)th shift register stage 713. For the sake of brevity, only the internal structure of the Nth shift register stage 712 is exemplified in detail. The other shift register stages are similar to the Nth shift register stage 712 and can be inferred by analogy. The circuit structure of the Nth shift register stage 712 is similar to that of the Nth shift register stage 512 shown in FIG. 5, differing in that the pull-down circuit 540 is replaced with the pull-down circuit 740. The pull-down circuit 740 comprises a second control unit 745, a first pull-down unit 755, a second pull-down unit 750 and a third pull-down unit 760. The second control unit 745, electrically connected to the input unit 530, is utilized for generating a second control signal Sc2 in response to the driving control voltage VQn and the second clock CK2. The first pull-down unit 755, electrically connected to the second control unit 745 and the gate line GLn, is utilized for pulling down the gate signal SGn in response to the second control signal Sc2. The second pull-down unit 750, electrically connected to the second control unit 745 and the input unit 530, is utilized for pulling down the driving control voltage VQn in response to the second control signal Sc2. The third pull-down unit 760, electrically connected to the (N+1)th shift register stage 713 and the gate line GLn, is utilized for pulling down the gate signal SGn in response to the gate signal SGn+1.

In the embodiment shown in FIG. 7, the first pull-down unit 755 comprises a fifth transistor 756, the second pull-down unit 750 comprises a sixth transistor 751, the second control unit 745 comprises a seventh transistor 746, an eighth transistor 747, a ninth transistor 748 and a tenth transistor 749, and the third pull-down unit 760 comprises an eleventh transistor 761. The fifth transistor 756 through the eleventh transistor 761 are thin film transistors or field effect transistors. The fifth transistor 756 comprises a first end electrically connected to the gate line GLn, a gate end electrically connected to the second control unit 745 for receiving the second control signal Sc2, and a second end for receiving the low power voltage Vss. The sixth transistor 751 comprises a first end electrically connected to the second end of the second transistor 531, a gate end electrically connected to the second control unit 745 for receiving the second control signal Sc2, and a second end for receiving the low power voltage Vss.

The seventh transistor 746 comprises a first end for receiving the second clock CK2, a second end electrically connected to both the gate ends of the fifth transistor 756 and the sixth transistor 751, and a gate end electrically connected to the ninth transistor 748. The eighth transistor 747 comprises a first end electrically connected to the second end of the seventh transistor 746, a gate end electrically connected to the second end of the second transistor 531, and a second end for receiving the low power voltage Vss. The ninth transistor 748 comprises a first end for receiving the second clock CK2, a gate end electrically connected to the first end, and a second end electrically connected to the gate end of the seventh transistor 746. The tenth transistor 749 comprises a first end electrically connected to the second end of the ninth transistor 748, a gate end electrically connected to the second end of the second transistor 531, and a second end for receiving the low power voltage Vss. The eleventh transistor 761 comprises a first end electrically connected to the gate line GLn, a gate end electrically connected to the (N+1)th shift register stage 713 for receiving the gate signal SGn+1, and a second end for receiving the low power voltage Vss.

The signal waveforms regarding the operation of the shift register circuit 700 are substantially identical to the signal waveforms shown in FIG. 6. In the operation of the shift register circuit 700, during the interval T4, the eleventh transistor 761 is capable of pulling down the gate signal SGn in response to the gate signal SGn+1. That is, both the fifth transistor 756 and the eleventh transistor 761 are employed to pull down the gate signal SGn. The internal structure of the second control unit 745 is well known to those skilled in the art and, for the sake of brevity, further similar discussion thereof is omitted.

In conclusion, compared with the prior-art shift register circuit, the shift register circuit of the present invention provides the gate signals having smaller voltage difference of falling edges for mitigating the feed-through effect. For that reason, the display quality of liquid crystal displays using the shift register circuit of the present invention can be enhanced following a reduction of image flicker. Besides, regarding the structure of the shift register circuit of the present invention, the pull-down circuit is not limited to the aforementioned embodiments, and any other circuit capable of pulling down the driving control voltage and the gate signal can be employed to replace the pull-down circuits illustrated in the aforementioned embodiments without having any substantial effect on the waveform-shaping function of the shift register circuit of the present invention.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Nth shift register stage of the shift register stages comprising:
    a first input unit, electrically connected to an (N−1)th shift register stage of the shift register stages for receiving an (N−1)th gate signal of the gate signals, for outputting a first driving control voltage in response to the (N−1)th gate signal;
    a pull-up unit, electrically connected to the first input unit and an Nth gate line of the gate lines, for pulling up an Nth gate signal of the gate signals in response to the first driving control voltage and a first clock, wherein the Nth gate line is employed to deliver the Nth gate signal;
    a pull-down circuit, electrically connected to the first input unit and the pull-up unit, for pulling down the first driving control voltage and the Nth gate signal;
    a second input unit, electrically connected to the (N−1)th shift register stage for receiving the (N−1)th gate signal, for outputting a second driving control voltage in response to the (N−1)th gate signal;
    a first control unit, electrically connected to the second input unit, for generating a first control signal in response to the second driving control voltage and an auxiliary signal;
    a waveform-shaping unit, electrically connected to the first control unit and the Nth gate line, for performing a waveform-shaping operation on the Nth gate signal in response to the first control signal; and
    a first pull-down unit, electrically connected to an (N+1)th shift register stage of the shift register stages for receiving an (N+1)th gate signal of the gate signals, for pulling down the second driving control voltage in response to the (N+1)th gate signal.

2. The shift register circuit of claim 1, wherein the Nth shift register stage further comprises:
    a capacitor, electrically connected between the first input unit and the Nth gate line, for storing the first driving control voltage.

3. The shift register circuit of claim 1, wherein the first input unit comprises a transistor, the transistor comprising:
    a first end, electrically connected to the (N−1)th shift register stage, for receiving the (N−1)th gate signal;
    a gate end electrically connected to the first end of the transistor; and
    a second end electrically connected to the pull-up unit and the pull-down circuit.

4. The shift register circuit of claim 1, wherein the pull-up unit comprises a transistor, the transistor comprising:
    a first end for receiving the first clock;
    a gate end, electrically connected to the first input unit, for receiving the first driving control voltage; and
    a second end electrically connected to the Nth gate line.

5. The shift register circuit of claim 1, wherein the second input unit comprises a transistor, the transistor comprising:
    a first end, electrically connected to the (N−1)th shift register stage, for receiving the (N−1)th gate signal;
    a gate end electrically connected to the first end of the transistor; and
    a second end electrically connected to the first control unit and the first pull-down unit.

6. The shift register circuit of claim 1, wherein the first control unit comprises a transistor, the transistor comprising:
    a first end for receiving the auxiliary signal;
    a gate end, electrically connected to the second input unit, for receiving the second driving control voltage; and
    a second end electrically connected to the waveform-shaping unit.

7. The shift register circuit of claim 1, wherein the first pull-down unit comprises a transistor, the transistor comprising:
    a first end electrically connected to the second input unit;
    a gate end, electrically connected to the (N+1)th shift register stage, for receiving the (N+1)th gate signal; and
    a second end for receiving a low power voltage.

8. The shift register circuit of claim 1, wherein the waveform-shaping unit comprises a transistor, the transistor comprising:
    a first end electrically connected to the Nth gate line;
    a gate end, electrically connected to the first control unit, for receiving the first control signal; and
    a second end for receiving a low power voltage.

9. The shift register circuit of claim 1, wherein the pull-down circuit comprises:
    a second control unit, electrically connected to the first input unit, for generating a second control signal in response to the first driving control voltage and a second clock having a phase opposite to the first clock;
    a second pull-down unit, electrically connected to the second control unit and the Nth gate line, for pulling down the Nth gate signal in response to the second control signal; and
    a third pull-down unit, electrically connected to the second control unit and the first input unit, for pulling down the first driving control voltage in response to the second control signal.

10. The shift register circuit of claim 9, wherein:
the second control unit comprises:
  a first transistor comprising a first end for receiving the second clock, a gate end electrically connected to the first end of the first transistor, and a second end electrically connected to both the second pull-down unit and the third pull-down unit; and
  a second transistor comprising a first end electrically connected to the second end of the first transistor, a gate end electrically connected to the first input unit for receiving the first driving control voltage, and a second end for receiving a low power voltage;
the second pull-down unit comprises:
  a third transistor comprising a first end electrically connected to the Nth gate line, a gate end electrically connected to the second end of the first transistor for receiving the second control signal, and a second end for receiving the low power voltage; and
the third pull-down unit comprises:
  a fourth transistor comprising a first end electrically connected to the first input unit, a gate end electrically connected to the second end of the first transistor for receiving the second control signal, and a second end for receiving the low power voltage.

11. The shift register circuit of claim 9, wherein the pull-down circuit further comprises:
  a fourth pull-down unit, electrically connected to the Nth gate line and the (N+1)th shift register stage, for pulling down the Nth gate signal in response to the (N+1)th gate signal.

12. The shift register circuit of claim 11, wherein:
the second control unit comprises:
  a first transistor comprising a first end for receiving the second clock, a second end electrically connected to both the second pull-down unit and the third pull-down unit, and a gate end;
  a second transistor comprising a first end electrically connected to the second end of the first transistor, a gate end electrically connected to the first input unit for receiving the first driving control voltage, and a second end for receiving a low power voltage;
  a third transistor comprising a first end for receiving the second clock, a gate end electrically connected to the first end of the third transistor, and a second end electrically connected to the gate end of the first transistor; and
  a fourth transistor comprising a first end electrically connected to the second end of the third transistor, a gate end electrically connected to the first input unit for receiving the first driving control voltage, and a second end for receiving the low power voltage;
the second pull-down unit comprises:
  a fifth transistor comprising a first end electrically connected to the Nth gate line, a gate end electrically connected to the second end of the first transistor for receiving the second control signal, and a second end for receiving the low power voltage;
the third pull-down unit comprises:
  a sixth transistor comprising a first end electrically connected to the first input unit, a gate end electrically connected to the second end of the first transistor for receiving the second control signal, and a second end for receiving the low power voltage; and
the fourth pull-down unit comprises:
  a seventh transistor comprising a first end electrically connected to the Nth gate line, a gate end electrically connected to the (N+1)th shift register stage for receiving the (N+1)th gate signal, and a second end for receiving the low power voltage.

13. A shift register circuit for providing plural gate signals to plural gate lines, the shift register circuit comprising a plurality of shift register stages, an Nth shift register stage of the shift register stages comprising:
  an input unit, electrically connected to an (N−1)th shift register stage of the shift register stages for receiving an (N−1)th gate signal of the gate signals, for outputting a driving control voltage in response to the (N−1)th gate signal;
  a pull-up unit, electrically connected to the input unit and an Nth gate line of the gate lines, for pulling up an Nth gate signal of the gate signals in response to the driving control voltage and a first clock, wherein the Nth gate line is employed to deliver the Nth gate signal;
  a pull-down circuit, electrically connected to the input unit and the pull-up unit, for pulling down the driving control voltage and the Nth gate signal;
  a first control unit, electrically connected to the input unit, for generating a first control signal in response to the driving control voltage and an auxiliary signal, the auxiliary signal being a pulse signal; and
  a waveform-shaping unit, electrically connected to the first control unit and the Nth gate line, for performing a waveform-shaping operation on the Nth gate signal in response to the first control signal.

14. The shift register circuit of claim 13, wherein the Nth shift register stage further comprises:
  a capacitor, electrically connected between the input unit and the Nth gate line, for storing the driving control voltage.

15. The shift register circuit of claim 13, wherein the input unit comprises a transistor, the transistor comprising:
  a first end, electrically connected to the (N−1)th shift register stage, for receiving the (N−1)th gate signal;
  a gate end electrically connected to the first end of the transistor; and
  a second end electrically connected to the pull-up unit, the pull-down circuit and the first control unit.

16. The shift register circuit of claim 13, wherein the pull-up unit comprises a transistor, the transistor comprising:
  a first end for receiving the first clock;
  a gate end, electrically connected to the input unit, for receiving the driving control voltage; and
  a second end electrically connected to the Nth gate line.

17. The shift register circuit of claim 13, wherein the first control unit comprises a transistor, the transistor comprising:
  a first end for receiving the auxiliary signal;
  a gate end, electrically connected to the input unit, for receiving the driving control voltage; and
  a second end electrically connected to the waveform-shaping unit.

18. The shift register circuit of claim 13, wherein the waveform-shaping unit comprises a transistor, the transistor comprising:
  a first end electrically connected to the Nth gate line;
  a gate end, electrically connected to the first control unit, for receiving the first control signal; and
  a second end for receiving a low power voltage.

19. The shift register circuit of claim 13, wherein the pull-down circuit comprises:
  a second control unit, electrically connected to the input unit, for generating a second control signal in response to the driving control voltage and a second clock having a phase opposite to the first clock;

a first pull-down unit, electrically connected to the second control unit and the Nth gate line, for pulling down the Nth gate signal in response to the second control signal; and a second pull-down unit, electrically connected to the second control unit and the input unit, for pulling down the driving control voltage in response to the second control signal.

20. The shift register circuit of claim 19, wherein:
the second control unit comprises:
   a first transistor comprising a first end for receiving the second clock, a gate end electrically connected to the first end of the first transistor, and a second end electrically connected to both the first pull-down unit and the second pull-down unit; and
   a second transistor comprising a first end electrically connected to the second end of the first transistor, a gate end electrically connected to the input unit for receiving the driving control voltage, and a second end for receiving a low power voltage;
the first pull-down unit comprises:
   a third transistor comprising a first end electrically connected to the Nth gate line, a gate end electrically connected to the second end of the first transistor for receiving the second control signal, and a second end for receiving the low power voltage; and
the second pull-down unit comprises:
   a fourth transistor comprising a first end electrically connected to the input unit, a gate end electrically connected to the second end of the first transistor for receiving the second control signal, and a second end for receiving the low power voltage.

21. The shift register circuit of claim 19, wherein the pull-down circuit further comprises:
   a third pull-down unit, electrically connected to an (N+1)th shift register stage of the shift register stages for receiving an (N+1)th gate signal of the gate signals, for pulling down the Nth gate signal in response to the (N+1)th gate signal.

22. The shift register circuit of claim 21, wherein:
the second control unit comprises:
   a first transistor comprising a first end for receiving the second clock, a second end electrically connected to both the first pull-down unit and the second pull-down unit, and a gate end;
   a second transistor comprising a first end electrically connected to the second end of the first transistor, a gate end electrically connected to the input unit for receiving the driving control voltage, and a second end for receiving a low power voltage;
   a third transistor comprising a first end for receiving the second clock, a gate end electrically connected to the first end of the third transistor, and a second end electrically connected to the gate end of the first transistor; and
   a fourth transistor comprising a first end electrically connected to the second end of the third transistor, a gate end electrically connected to the input unit for receiving the driving control voltage, and a second end for receiving the low power voltage;
the first pull-down unit comprises:
   a fifth transistor comprising a first end electrically connected to the Nth gate line, a gate end electrically connected to the second end of the first transistor for receiving the second control signal, and a second end for receiving the low power voltage;
the second pull-down unit comprises:
   a sixth transistor comprising a first end electrically connected to the input unit, a gate end electrically connected to the second end of the first transistor for receiving the second control signal, and a second end for receiving the low power voltage; and
the third pull-down unit comprises:
   a seventh transistor comprising a first end electrically connected to the Nth gate line, a gate end electrically connected to the (N+1)th shift register stage for receiving the (N+1)th gate signal, and a second end for receiving the low power voltage.

* * * * *